(12) United States Patent
Matsumoto et al.

(10) Patent No.: US 10,637,105 B2
(45) Date of Patent: Apr. 28, 2020

(54) BATTERY EMBEDDED ARCHITECTURE FOR SUPPLYING APPROPRIATE VOLTAGE

(71) Applicant: International Business Machines Corporation, Armonk, NY (US)

(72) Inventors: Keiji Matsumoto, Yokohama (JP); Hiroyuki Mori, Yasu (JP)

(73) Assignee: International Business Machines Corporation, Armonk, NY (US)

(*) Notice: Subject to any disclaimer, the term of this patent is extended or adjusted under 35 U.S.C. 154(b) by 176 days.

(21) Appl. No.: 15/697,848

(22) Filed: Sep. 7, 2017

(65) Prior Publication Data

US 2019/0074552 A1  Mar. 7, 2019

(51) Int. Cl.
*H01M 10/42*  (2006.01)
*H01M 2/10*  (2006.01)
(Continued)

(52) U.S. Cl.
CPC ....... *H01M 10/425* (2013.01); *H01M 2/0202* (2013.01); *H01M 2/1022* (2013.01); *H01M 2/26* (2013.01); *H01M 2/30* (2013.01); *H01M 10/044* (2013.01); *H01M 10/049* (2013.01); *H01M 10/0445* (2013.01); *H01M 10/0562* (2013.01); *H01M 10/0585* (2013.01); *H01M 10/482* (2013.01); *H05K 1/0262* (2013.01); *H05K 1/111* (2013.01); *H05K 1/115* (2013.01); *H05K 1/185* (2013.01); *H01M 10/052* (2013.01); *H01M 10/0525* (2013.01); *H01M 2220/30* (2013.01); *H01M 2300/0068* (2013.01); *H05K 3/4602* (2013.01); *H05K 2201/10037* (2013.01); *H05K 2201/10106* (2013.01); *H05K 2203/1469* (2013.01)

(58) Field of Classification Search
CPC ........... H01M 10/0562; H01M 10/425; H01M 10/482; H01M 2220/30; H01M 2300/0068; H01M 2/1022; H05K 1/111; H05K 1/115

See application file for complete search history.

(56) References Cited

U.S. PATENT DOCUMENTS

2006/0183316 A1* 8/2006 Larnerd ................. H05K 1/115
                                                                   438/622
2013/0260182 A1* 10/2013 Knitt ..................... H01M 2/1077
                                                                   429/7

(Continued)

*Primary Examiner* — Basia A Ridley
*Assistant Examiner* — Heng M. Chan
(74) *Attorney, Agent, or Firm* — Alexander G. Jochym

(57) ABSTRACT

A battery embedded structure is disclosed. The battery embedded structure comprises a substrate including one or more stacked battery units. Each stacked battery unit includes two or more conductive layers and one or more unit cells. Each unit cell is disposed between two conductive layers. The substrate has a principal surface provided by one or more respective side surfaces of the one or more stacked battery units. The battery embedded structure also comprises a wiring layer disposed on the principal surface of the substrate. The wiring layer includes a plurality of electrical paths and a plurality of vias. Each via is connected with one electrical path. Each via is located at a position corresponding to an edge surface of a conductive layer of the two or more conductive layers of the one or more stacked battery units so as to contact electrically to that conductive layer.

5 Claims, 15 Drawing Sheets

(51) Int. Cl.

| | |
|---|---|
| *H01M 10/48* | (2006.01) |
| *H01M 10/0585* | (2010.01) |
| *H01M 2/02* | (2006.01) |
| *H01M 2/26* | (2006.01) |
| *H01M 10/04* | (2006.01) |
| *H05K 1/11* | (2006.01) |
| *H05K 1/18* | (2006.01) |
| *H05K 3/46* | (2006.01) |
| *H01M 10/0562* | (2010.01) |
| *H01M 2/30* | (2006.01) |
| *H05K 1/02* | (2006.01) |
| *H01M 10/052* | (2010.01) |
| *H01M 10/0525* | (2010.01) |

(56) References Cited

U.S. PATENT DOCUMENTS

| | | | |
|---|---|---|---|
| 2015/0188195 A1* | 7/2015 | Matsushita | H01M 10/0585 |
| | | | 429/152 |
| 2015/0349373 A1 | 12/2015 | Snyder et al. | |
| 2016/0028128 A1 | 1/2016 | Limvorapun | |
| 2016/0049624 A1 | 2/2016 | Bhardwaj et al. | |
| 2016/0049703 A1* | 2/2016 | Lobert | H01M 10/625 |
| | | | 429/62 |

\* cited by examiner

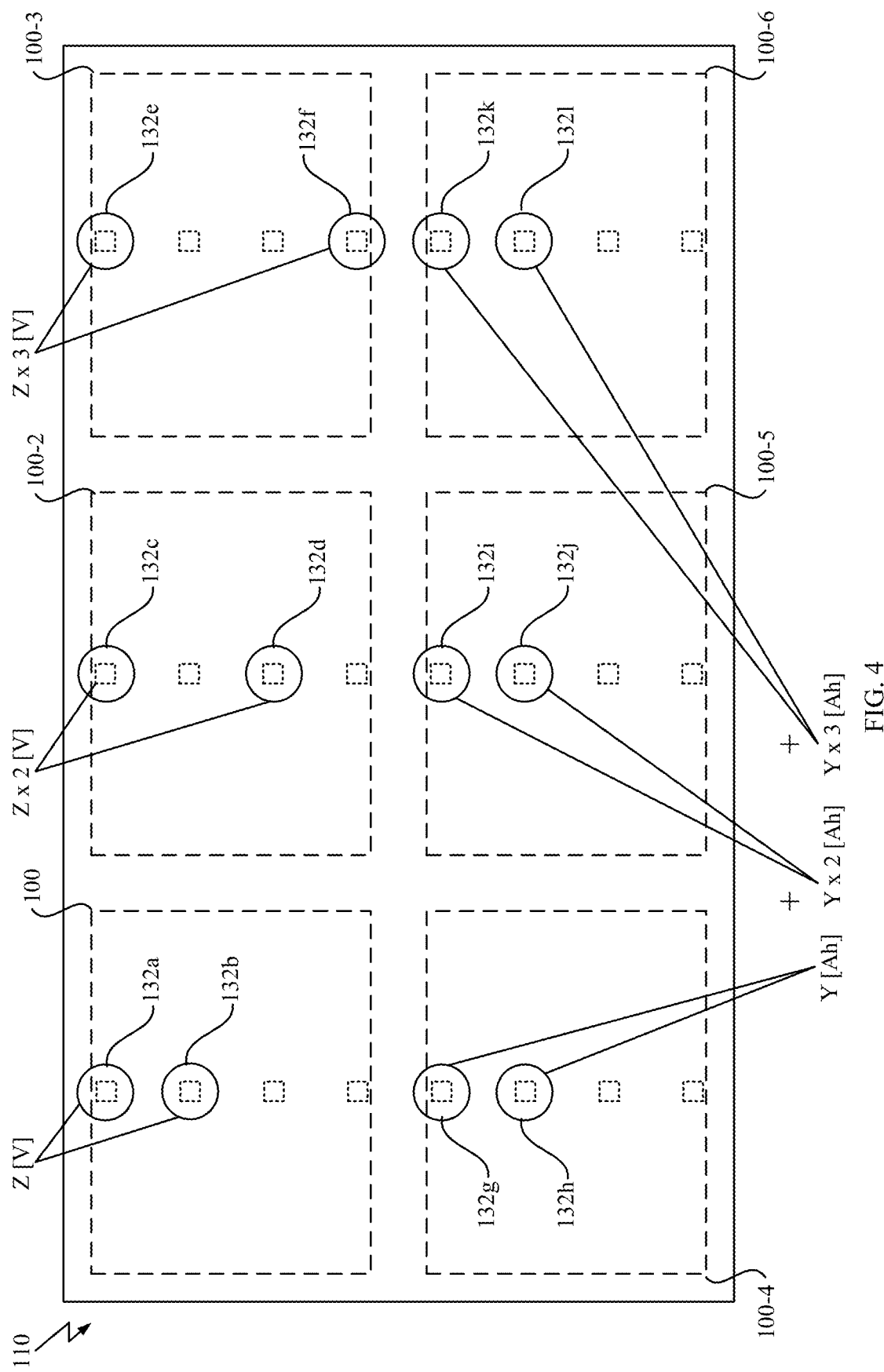

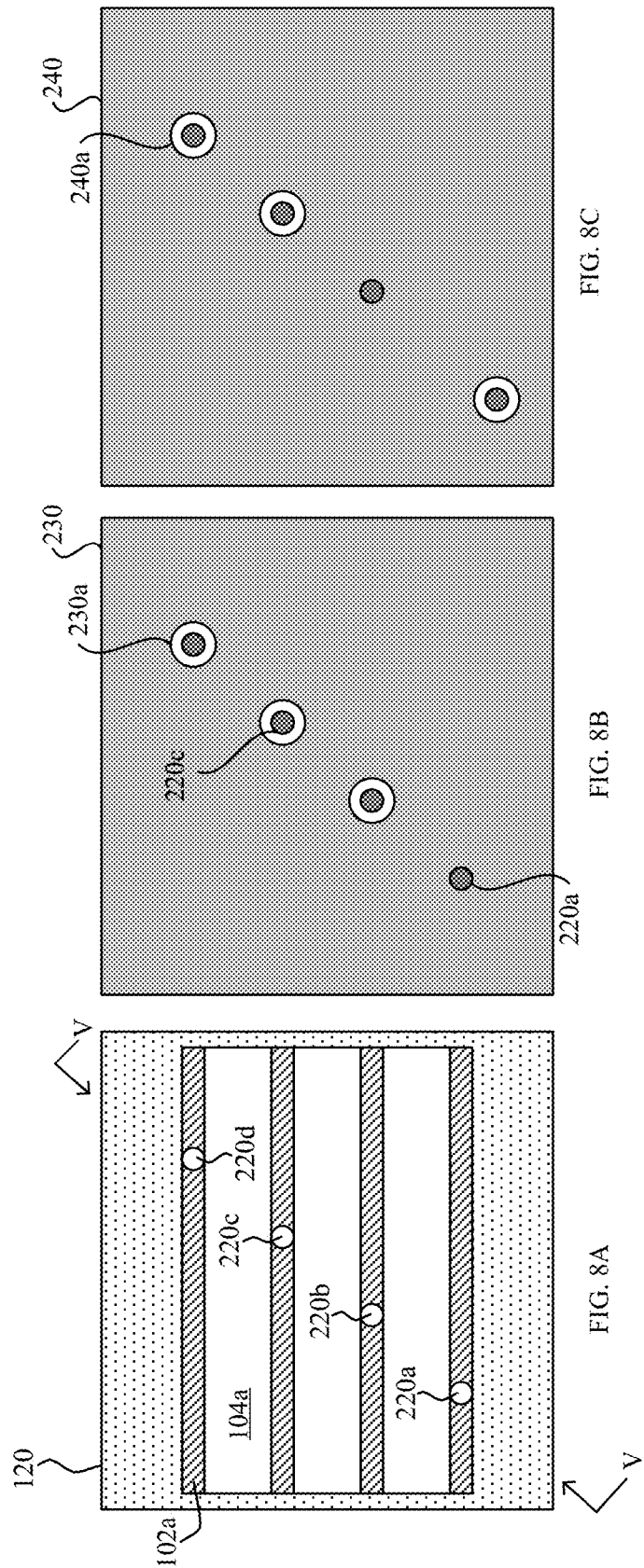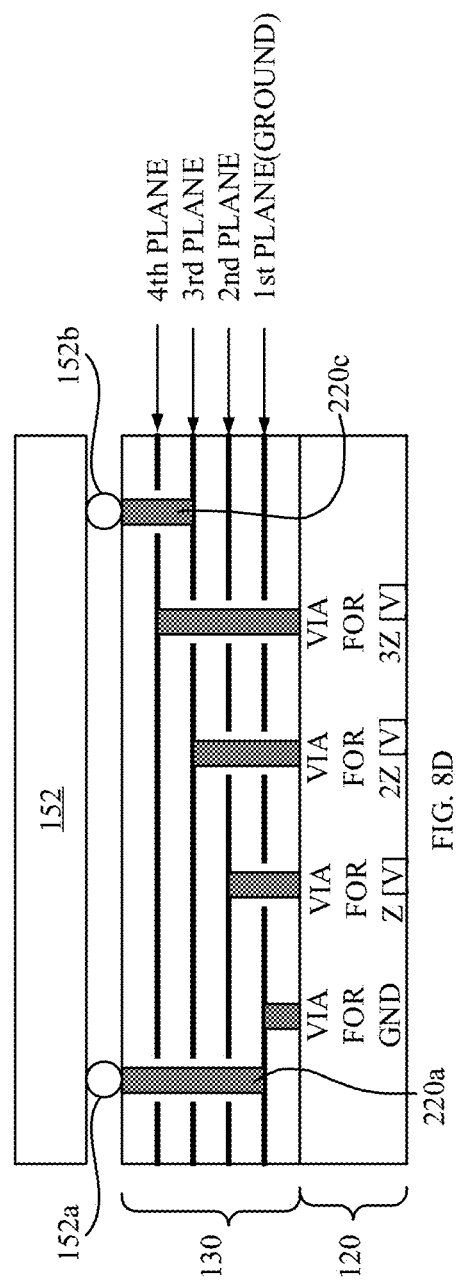

BATTERY EMBEDDED ARCHITECTURE FOR SUPPLYING APPROPRIATE VOLTAGE

BACKGROUND

The present invention, generally, relates to battery technology, more particularly, to battery embedded structures and methods for fabricating thereof.

Recently, all-solid-state batteries such as all-solid-state ceramic battery have been seen as promising rechargeable batteries for mobile devices, including small computing systems, in terms of its excellent safety. Since the all-solid-state battery has a thin film structure, it gives high power density but small capacity per unit area. Accordingly, in supplying electric power, power loss is requested to be as reduced as possible.

Mobile devices typically include a variety of electronic components such as a processer, a sensor, a memory, a light emitting diode (LED), etc., each of which requires certain supply voltage and capacity. Generally, a regulator for converting from a battery voltage to appropriate supply voltages for the electronic components is provided.

SUMMARY

According to an embodiment of the present invention there is provided a battery embedded structure. The battery embedded structure comprises a substrate including one or more stacked battery units. Each stacked battery unit of the one or more stacked battery units includes two or more conductive layers and one or more unit cells. Each unit cell of the one or more unit cells is disposed between two conductive layers of the two or more conductive layers. The substrate has a principal surface provided by one or more respective side surfaces of the one or more stacked battery units. The battery embedded structure also comprises a wiring layer disposed on the principal surface of the substrate. The wiring layer includes a plurality of electrical paths and a plurality of vias. Each via of the plurality of vias is connected with one electrical path of the plurality of electrical paths. Each via of the plurality of vias is located at a position corresponding to an edge surface of a conductive layer of the two or more conductive layers of the one or more stacked battery units so as to contact electrically to that conductive layer.

According to another embodiment of the present invention there is provided a method for fabricating a battery embedded structure. The method includes preparing one or more stacked battery units. Each stacked battery unit of the one or more stacked battery units includes two or more conductive layers and one or more unit cells. Each unit cell of the one or more unit cells is disposed between two conductive layers of the two or more conductive layers. The method further includes fabricating a substrate including the one or more stacked battery units. The substrate has a principal surface provided by one or more respective side surfaces of the one or more stacked battery units. The method further includes forming a wiring layer. The wiring layer includes a plurality of electrical paths and a plurality of vias. Each via of the plurality of vias is connected with one electrical path of the plurality of electrical paths. The method further includes bonding the wiring layer with the principal surface of the substrate. Each via of the plurality of vias is located at a position corresponding to an edge surface of a conductive layer of the two or more conductive layers of the one or more stacked battery units so as to contact electrically to that conductive layer.

According to yet another embodiment of the present invention there is provided a wiring structure. The wiring structure is to be disposed on a substrate including one or more stacked battery units. Each stacked battery unit of the one or more stacked battery units includes two or more conductive layers and one or more unit cells. Each unit cell of the one or more unit cells is disposed between two conductive layers of the two or more conductive layers. The substrate has a principal surface provided by one or more respective side surfaces of the one or more stacked battery units. The wiring structure includes comprises a plurality of pads on which one or more electronic components are to be mounted by respective terminals thereof. The wiring structure also includes a plurality of electrical paths each connected with one group of the pads. The wiring structure also includes a plurality of vias. Each via of the plurality of vias is connected with one electrical path of the plurality of electrical paths. Each via is configured to be located at a position corresponding to an edge surface of a conductive layer of the two or more conductive layers of the one or more stacked battery units so as to contact electrically to that conductive layer.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter, which is regarded as the invention, is particularly pointed out and distinctly claimed in the claims at the conclusion of the specification. The forgoing and other features and advantages of the invention are apparent from the following detailed description taken in conjunction with the accompanying drawings. Note that the sizes and relative positions of elements and layers in the drawings are not necessarily drawn to scale. Some of these elements or layers are arbitrarily enlarged and positioned for improving legibility of drawing.

FIG. 4 describes ways for supplying power with appropriate voltage and capacity from the battery embedded structure according to an exemplary embodiment of the present invention.

FIGS. 8A-8D illustrate relationships between a wiring pattern in the wiring layer and positions of vias according to an exemplary embodiment of the present invention.

DETAILED DESCRIPTION

Mobile devices typically include a variety of electronic components such as a processer, a sensor, a memory, a light emitting diode (LED), etc., each of which requires certain supply voltage and capacity, there is needed a way for supplying power with appropriate voltages and capacities for the electronic components. Generally, a regulator for converting from a battery voltage to appropriate supply voltages for the electronic components is provided. However, power loss due to voltage conversion by the regulator may not be negligible. Therefore, there is a need for a technique capable of supplying power with appropriate voltage and/or capacity for an electronic component.

The present invention will now be described using particular embodiments, and the embodiments described hereafter are understood to be only examples and are not intended to limit the scope of the present invention.

Aspects of the present invention are directed to a battery embedded structure including one or more stacked battery units embedded therein, a method for fabricating the battery embedded structure, a wiring structure to be disposed on a substrate for the battery embedded structure, and an electronic device including the battery embedded structure.

Hereinafter, referring to FIGS. 1A, 1B, 2, 3, and 4, a battery embedded structure will be described, according to an exemplary embodiment of the present invention.

Figure 1A:
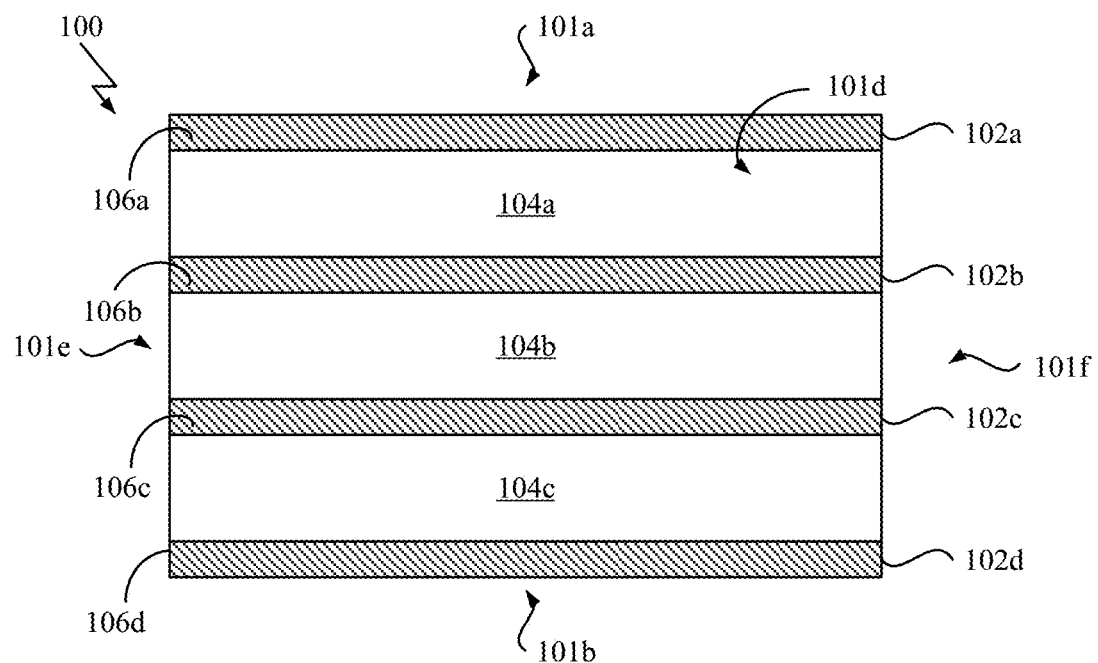
FIGS. 1A and 1B illustrate a side view and a top view of a stacked battery unit used to build a battery embedded structure according to an exemplary embodiment of the present invention.
Figure 1B:
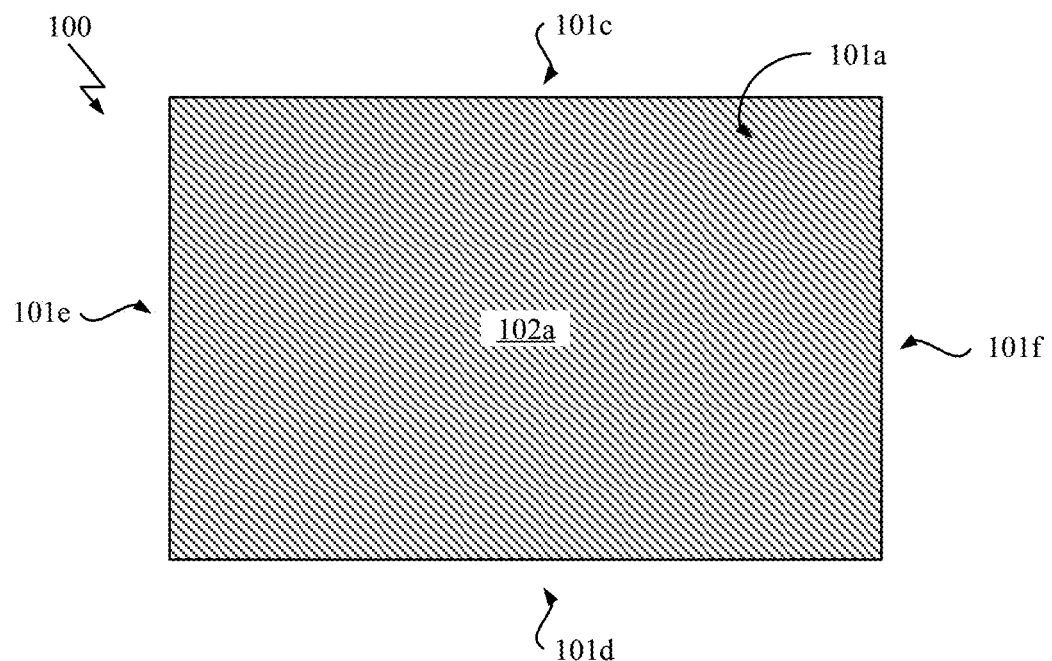

First, referring to FIGS. 1A and 1B, stacked battery unit 100, which is used to build a novel battery embedded structure according to an exemplary embodiment of the present invention, is described. FIGS. 1A and 1B show a side view and a top view of stacked battery unit 100, respectively.

As shown in FIG. 1A, stacked battery unit 100 includes conductive layers 102a-d, and unit cells 104a-c, each of which is disposed between an upper and a lower conductive layer.

In FIG. 1A, there are four conductive layers, conductive layers 102a-d, and three unit cells, unit cells 104a-c in stacked battery unit 100 for the purpose of this illustration. However, the number of the conductive layers and the number of the unit cells in stacked battery unit 100 may not be limited to those of the specific embodiment shown in FIG. 1A. In other embodiments, two, three or more than four conductive layers and one, two or more than three unit cells may be stacked to form one stacked battery unit.

In one embodiment, each unit cell, of unit cells 104a-c, may include an anode, an electrolyte, and a cathode. In particular embodiments, the anode and the cathode may be made up of solid materials and the electrolyte may be a solid electrolyte.

In one embodiment, each conductive layer, of conductive layers 102a-d, acts as a current collector. In particular embodiments, stacked battery unit 100 may have a bipolar structure, in which anode active material is formed on one side surface of an intermediate conductive layer (i.e., conductive layers 102b and 102c in FIG. 1A) and cathode active material is formed on another side surface of the intermediate conductive layer (i.e., conductive layers 102b and 102c in FIG. 1A). In a particular embodiment, stacked battery unit 100 may include merely battery components without any interlayer dielectric layer.

In one embodiment, conductive layers 102a-d, may be made of any one metal material (e.g., Cu, Pt, Al, Au, etc.), other conductive materials (e.g. graphite, carbon nanotube, silicon, etc.), or any combinations thereof as long as the combination is adequate for materials of the cathode and the anode.

In preferred embodiments, stacked battery unit 100 may be fabricated as an all-solid-state stacked battery. The cathode may be made of crystalline or nano-crystalline lithium intercalation compounds such as $LiCoO_2$, $LiNiO_2$, $LiMn_2O_4$, to name but a few. The electrolyte may be any solid electrolyte such as a lithium oxide based electrolyte (e.g. a lithium phosphorus oxynitride (LiPON), lithium lanthanum titanium oxide (LLTO), etc.), a lithium sulfide based electrolyte, or other lithium phosphate based electrolytes such as a lithium borophosphate (LiBP). The anode may be made of metallic lithium or nitrides such as silicon tin oxynitride (SiTON), tin and zinc nitrides, to name but a few.

Each unit cell gives nominal cell voltage depending on characteristics of the active materials and has a certain nominal discharge capacity.

As shown in FIGS. 1A and 1B, stacked battery unit 100 has a plurality of surfaces, including top surface 101a, bottom surface 101b, back surface 101c, front surface 101d, left surface 101e, and right surface 101f. As illustrated in FIG. 1B, each conductive layer of conductive layers 102a-d has a planer shape extending along top surface 101a and bottom surface 101b. Back surface 101c, front surface 101d, left surface 101e, and right surface 101f of stacked battery unit 100 each have respective edge surfaces (e.g., edge surfaces 106a-d for front surface 101d) of conductive layers 102a-d.

Figure 2:
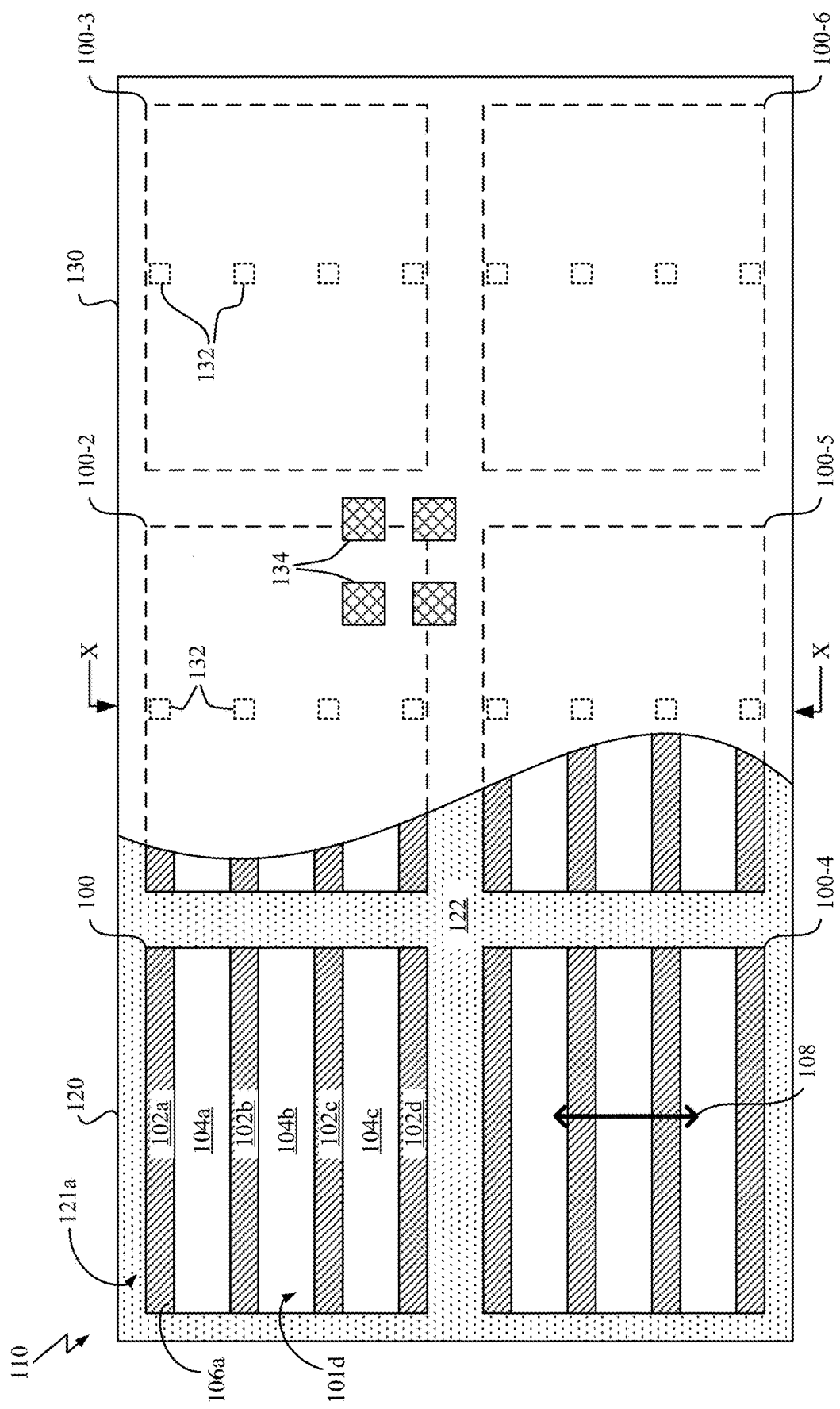
FIG. 2 illustrates a top view of the battery embedded structure according to an exemplary embodiment of the present invention.
Figure 3:
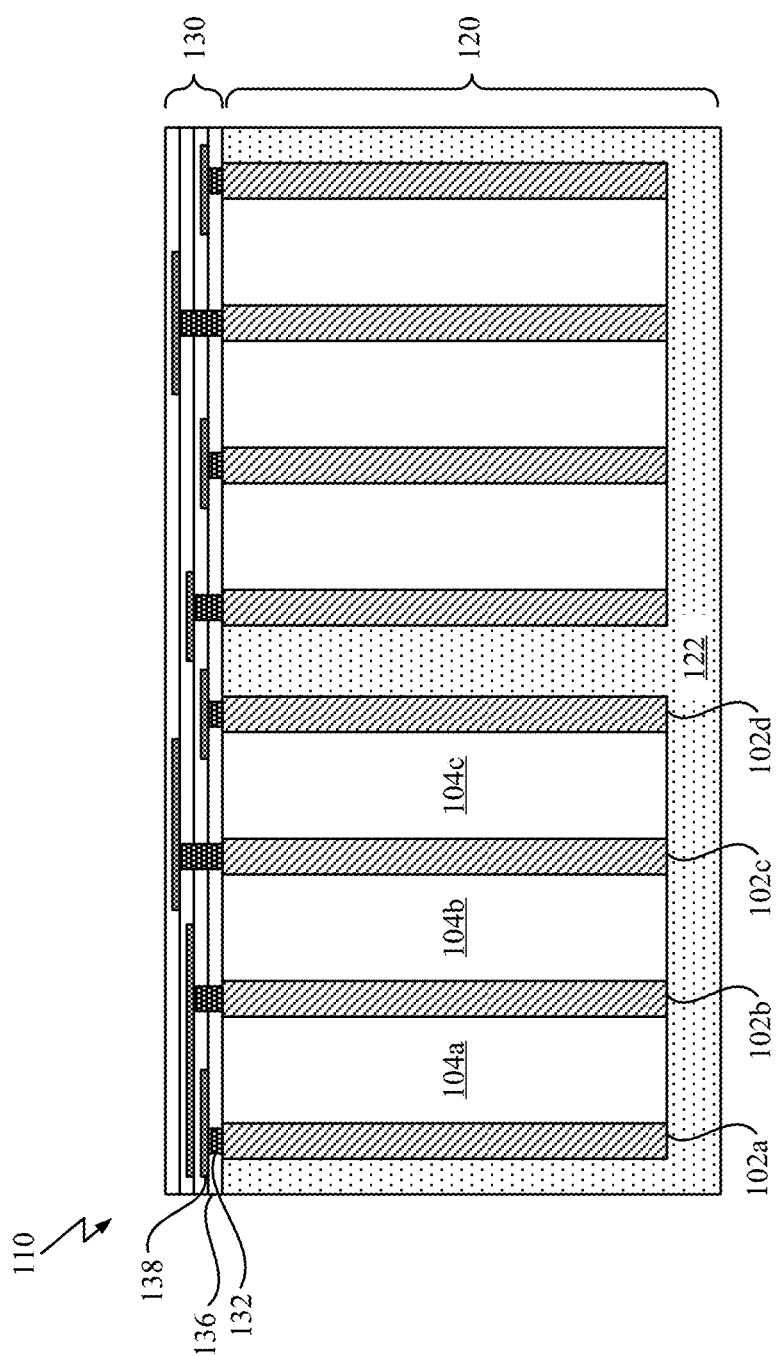
FIG. 3 illustrates a cross-sectional view of the battery embedded structure according to an exemplary embodiment of the present invention.

Referring to FIG. 2 and FIG. 3, battery embedded structure 110, built from one or more stacked battery units shown in FIGS. 1A and 1B, is described. FIG. 2 and FIG. 3 illustrate a top view and a cross-sectional view of battery embedded structure 110, respectively. The cross-sectional view shown in FIG. 3 corresponds to a cross-section through the line indicated by arrows "X" in FIG. 2.

As shown in FIG. 2 and FIG. 3, battery embedded structure 110 includes substrate 120 and wiring layer 130 disposed thereon. Note that a part of wiring layer 130 on substrate 120 is omitted from FIG. 2 to reveal a structure under wiring layer 130 as indicated by a curved line. Also note that outlines of stacked battery units 100, 100-2, 100-3, 100-4, 100-5, and 100-6 under wiring layer 130 are indicated by dashed lines.

As shown in FIG. 2 and FIG. 3, substrate 120 may include one or more stacked battery units (e.g., stacked battery units 100, 100-2, 100-3, 100-4, 100-5, and 100-6 as shown in FIG. 2), each of which is arranged with its front surface (e.g. front surface 101d for stacked battery unit 100) facing up. Substrate 120 may have a top surface (principal surface) 121a that includes respective one or more side surfaces of the one or more stacked battery units (e.g. front surface 101d for stacked battery unit 100). Each stacked battery unit may be placed to have a stacking direction 108 perpendicular to normal of top surface 121a. In the embodiment shown in FIG. 2, the one or more stacked battery units have same stacking direction.

In one or more embodiments, the one or more stacked battery units may form an array arranged in at least one dimension. In the particular embodiment shown in FIG. 2, the array is a two-dimensional array arranged along top surface 121a of substrate 120. Since it is technically difficult to increase the number of stacking unit cells in one stacked battery unit, a plurality of stacked battery units may be preferably arranged in a direction identical to the stacking direction of stacked battery unit 100. From the viewpoint of increasing a degree of freedom for design to obtain appropriate voltage and capacity as will be described later, a plurality of stacked battery units may be also preferably arranged in a direction perpendicular to the stacking direction.

In FIG. 2, there are a total of six stacked battery units, stacked battery units 100, 100-2, 100-3, 100-4, 100-5, and 100-6, arranged in a two dimensional array having two rows and three columns for the purpose of this illustration. However, the number of stacked battery units and the number of the rows and columns in the array are not limited to those of the specific embodiment shown in FIG. 2. In other embodiments, less than six or more than six stacked battery units may be arranged in any layout to build battery embedded structure 110. Substrate 120 including merely a single stacked battery unit is not excluded as long as adequate capacity can be obtained.

Top surface 121a of substrate 120 may be provided by one or more respective side surfaces of the one or more stacked battery units arranged in the array (e.g. front surface 101d for stacked battery unit 100). Top surface 121a may have respective edge surfaces of one or more conductive layers and one or more unit cells of the one or more stacked battery units while exposing, at least in part, the respective edge surfaces (e.g., edge surface 106a for conductive layer 102a) of the conductive layers.

Substrate 120 may further include insulator 122 that surrounds the one or more stacked battery units, stacked battery units 100, 100-2, 100-3, 100-4, 100-5, and 100-6, and fills into gaps between the stacked battery units in the array. Insulator 122 may be made from a resin material such as epoxy resins and appropriate fillers if necessary.

Wiring layer 130 may be disposed on top surface 121a of substrate 120. Wiring layer 130 may include a plurality of electrical paths, a plurality of vias 132, and a plurality of pads 134. Note that locations of vias 132 formed at a bottom of wiring layer 130 are indicated by dotted squares and locations of pads 134 formed at a top of wiring layer 130 are indicated by solid squares with cross hatching pattern in FIG. 2. The electrical paths in wiring layer 130 are not shown in FIG. 2.

Each via of vias 132 is located at a position corresponding to an edge surface of one of the conductive layers (e.g., edge surface 106a of conductive layer 102a) of the one or more stacked battery units in the array. In FIG. 2 and FIG. 3, vias 132 are located at respective positions corresponding to respective edge surfaces of the conductive layers in a one-on-one manner. However, vias 132 may be formed at respective positions corresponding to a part of the all conductive layers. The plurality of pads 134 may include a plurality of groups of pads, on which one or more electronic components can be mounted by respective terminals thereof.

Wiring layer 130 may include at least one dielectric layer 136, at least one conductive pattern layer 138 and a plurality of vias 132 formed through dielectric layer 136 as shown in FIG. 3. Dielectric layer 136 may be made from a resin material such as polyimide, a BCB (benzocyclobutene) resin and other polymers. Conductive pattern layer 138 may be made of any one of metal materials (e.g., Cu, Al, AlCu, etc.) and combinations thereof.

Battery embedded structure 110 described by referring to FIG. 2 and FIG. 3 can be used as an interposer on which one or more electronic components such as a processer, a sensor, a memory, a light emitting device (LED) are to be mounted.

The electronic component may have a condition on supply voltage and/or discharge capacity (power consumption). The plurality of pads 134 formed at the top of wiring layer 130 has a set of groups of pads for each electronic component to be mounted. The groups of pads may be electrically connected with respective groups of one or more vias selected from among the plurality of vias 132 through corresponding electrical paths so as to obtain an expected voltage and/or an expected discharge capacity that satisfy the condition for each electronic component.

FIG. 4 depicts five ways for supplying power to an electronic component with appropriate voltage and discharge capacity from battery embedded structure 110. Note that a set of vias to be connected electrically with one electronic component (i.e., its power supply terminals) is indicated by a set of circles connected by a line in FIG. 4.

As shown in FIG. 4, when an electronic component receives power from a set of vias, via 132a (i.e., a group consisting of one via 132a) and via 132b (i.e., a group consisting of one via 132b) located on corresponding conductive layers that sandwich one unit cell in stacked battery unit 100, the voltage of Z [V], which is identical to cell voltage expected to be obtained from a single unit cell, can be obtained. When an electronic component receives power from a set of vias, via 132c and via 132d located on corresponding conductive layers that sandwich two unit cells in stacked battery unit 100-2, the voltage of Z×2 [V], that is double of the single cell voltage Z, can be obtained. Similarly, when power is supplied from a set of vias, via 132e and via 132f located on corresponding conductive layers sandwiching three unit cells in stacked battery unit 100-3, the voltage of Z×3 [V], that is a triple of the single cell voltage Z, can be obtained.

Further referring to FIG. 4, when power is supplied from a set of a group of vias, via 132g and via 132i, and a group of vias, via 132h and via 132j that belong to two different stacked battery units, stacked battery units 100-4 and 100-5, the discharge capacity of Y×2 [Ah], which is a double of the discharge capacity expected to be obtained from single unit cell, can be obtained. Similarly, when power is supplied from a set of a group of vias, via 132g, via 132i, and via 132k, and a group of vias, via 132h, via 132j, and via 132l that belong to three different stacked battery units, stacked battery units 100-4, 100-5, and 100-6, the discharge capacity of Y×3 [Ah], which is a triple of discharge capacity expected to be obtained from one unit cell, can be obtained. Although not shown, the discharge capacity of Y×2 or 3 [Ah] with the voltage of Z×2 or 3 [V] can also be obtained when connecting the electronic component with appropriate vias.

In this manner, the novel battery embedded structure 110 according to the exemplary embodiment of the present invention can supply power to one or more electronic components with appropriate voltages and discharge capacities by selectively connecting groups of the plurality of vias 132 and groups of the plurality of pads 134. In a particular embodiment, the connection between the groups of the plurality of vias 132 and the groups of the plurality of pads 134 may be statically configured by the wring pattern. However, in other embodiments, dynamical configuration of the connections between the vias and the pads may also be contemplated.

The structure of battery embedded structure 110 may not be limited to the specific embodiments shown in FIG. 2 and FIG. 3. Although not shown in FIG. 2 and FIG. 3, battery embedded structure 110 may include other optional members. For example, substrate materials for typical interposers such as core for build-up substrate, a silicon, a alumina ceramic, a glass, mica, to name but a few, may be used to provide an outer region of a part where the one or more stacked battery units are embedded. A backside wiring layer may also be formed on the bottom surface of the battery embedded structure 110. Furthermore, through vias may also be formed through the substrate 120 to provide electrical paths between electronic components on front side of battery embedded structure 110 and those on the back side of battery embedded structure 110.

Referring to FIGS. 5A and 5B and FIGS. 6A and 6B, a process for fabricating a battery embedded structure according to an exemplary embodiment of the present invention is described. FIGS. 5A-5B and FIGS. 6A-6B illustrate top views of a structure being fabricated at each step of the fabrication process of battery embedded structure 110.

Figure 5A:
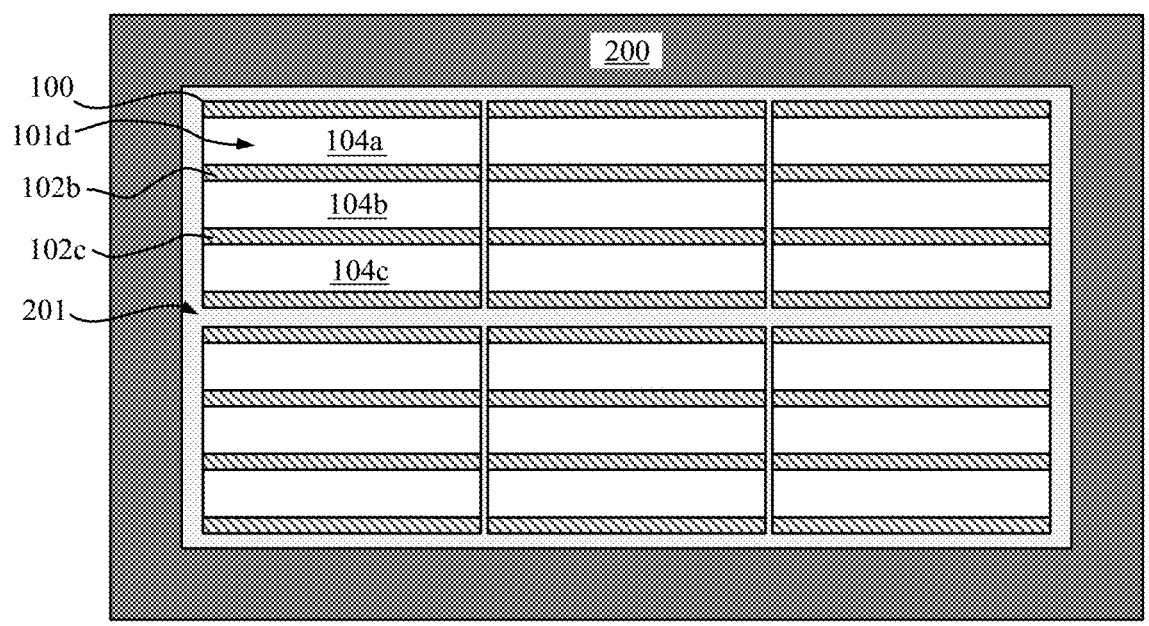
FIGS. 5A-5B describe a first part of a process for fabricating a battery embedded structure according to an exemplary embodiment of the present invention.

As shown in FIG. 5A, the fabrication process may include a step of preparing one or more stacked battery units on a support carrier, each of which is placed with its side surface (e.g., front surface 101d for stacked battery unit 100) facing up. Each stacked battery unit includes two or more conductive layers and one or more unit cells (e.g., conductive layers 102b-c and unit cells 104a-c for stacked battery unit 100). Each stacked battery unit may be fabricated by any known conventional process or purchased from any supplier. In a preferable embodiment, the stacked battery units are precisely positioned on the support carrier. The one or more stacked battery units may be arranged in at least one dimension within mold frame 200 so as to form an array, that is preferably a two dimensional array. There are gaps 201 between the stacked battery units in mold frame 200.

Figure 5B:
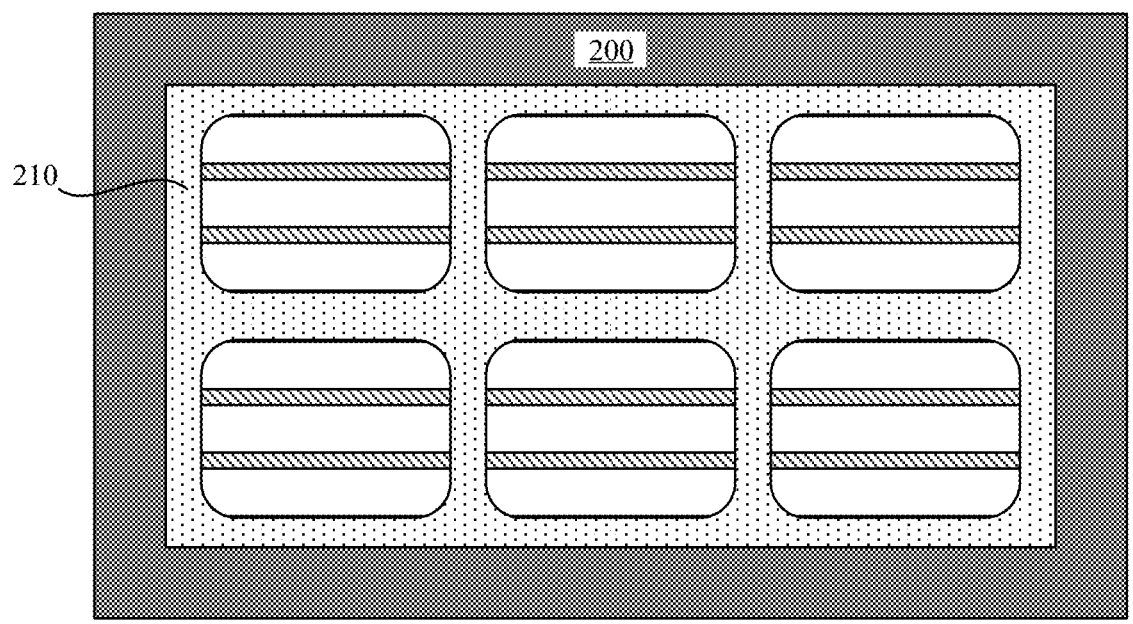

As shown in FIG. 5B, the fabrication process may include a step of filling insulator material 210 into gaps between the stacked battery units in mold frame 200. Insulator material 210 filled into the gaps between the stacked battery units may be a resin material such as epoxy resin, and such resin material may be cured before proceeding to next step.

Figure 6A:
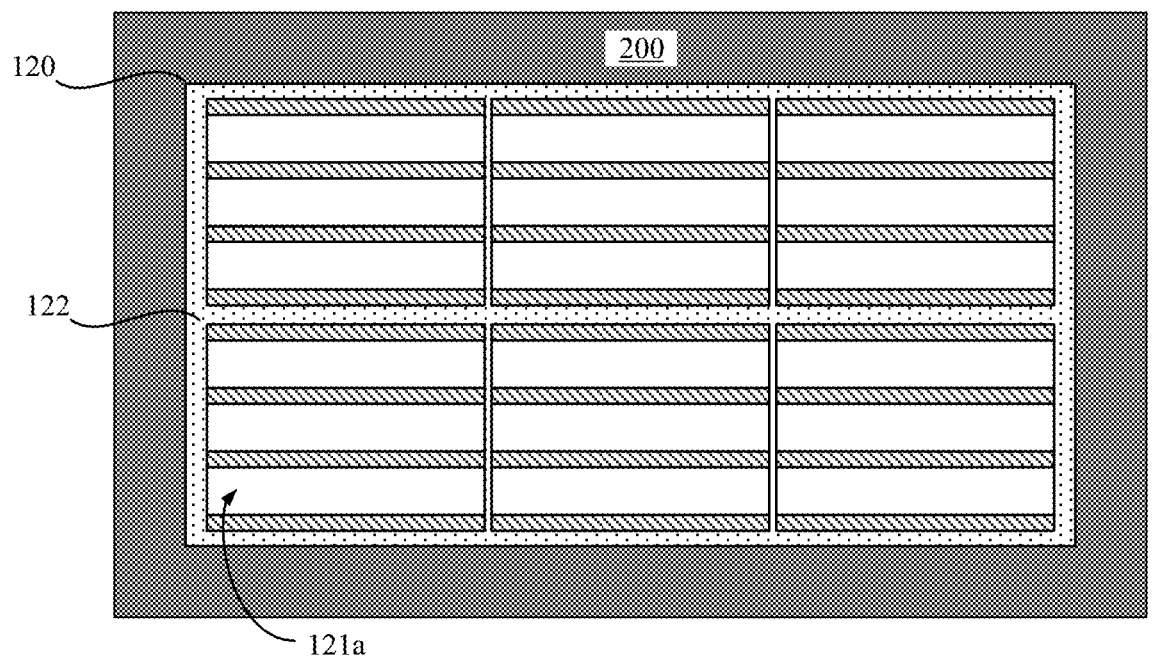
FIGS. 6A-6B describe a second part of a process for fabricating the battery embedded structure according to an exemplary embodiment of the present invention.

As shown in FIG. 6A, the fabrication process may include a step of polishing the one or more respective side surfaces of the one or more stacked battery units (e.g. front surface 101d for stacked battery unit 100) together with insulator material 210 to make top surface 121a of substrate 120 smooth and flat. Any parts that protrude above the side surfaces (e.g., front surface 101d for stacked battery unit 100) may be preferably removed by polishing process. Top surface 121a of substrate 120 may be provided by one or more respective side surfaces of the one or more stacked battery units (e.g. front surface 101d for stacked battery unit 100). After the polishing process, insulator 122 surrounds the one or more stacked battery units.

By performing the steps shown in FIGS. 5A, 5B and 6A, substrate 120 including the one or more stacked battery units embedded therein can be fabricated so as to have smooth, flat top surface 121a, that is provided by one or more respective side surfaces of the one or more stacked battery units arranged in the array (e.g. front surface 101d for stacked battery unit 100).

Figure 6B:
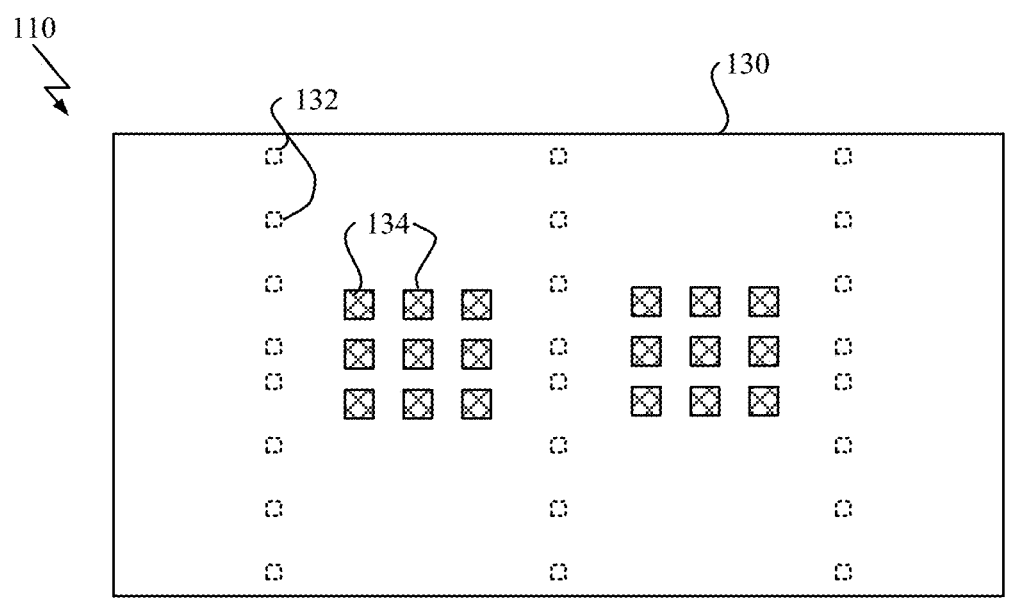

As shown in FIG. 6B, the fabrication process may include a step of forming wiring layer 130, on battery embedded structure 110, that includes a plurality of electrical paths, a plurality of vias 132 and a plurality of pads 134. Each via of the plurality of vias 132 may be connected with one of the electrical paths. Each pad of the plurality of pads 134 may be connected with one of the electrical paths. In this step, wiring layer 130 may be bonded with top surface 121a of substrate 120 by the bottom surface of wiring layer 130 such that each via of the plurality of vias 132 is located at a position corresponding to an edge surface of one of the conductive layers (e.g., edge surface 106a of conductive layer 102a) of the one or more stacked battery units in the array.

Wiring layer 130 can be fabricated on top surface 121a of substrate 120 by using any known wiring technologies for build-up board or redistribution layer, including subtractive, full-additive, semi-additive processes and combination thereof. Note that since the edge surfaces of the conductive layers of the stacked battery units (e.g., edge surface 106a of conductive layer 102a of stacked battery unit 100) are exposed on top surface 121a of substrate 120, it is preferable to avoid making a short circuit that would cause damage on the battery cells during the formation process of wiring layer 130.

Figure 7A:
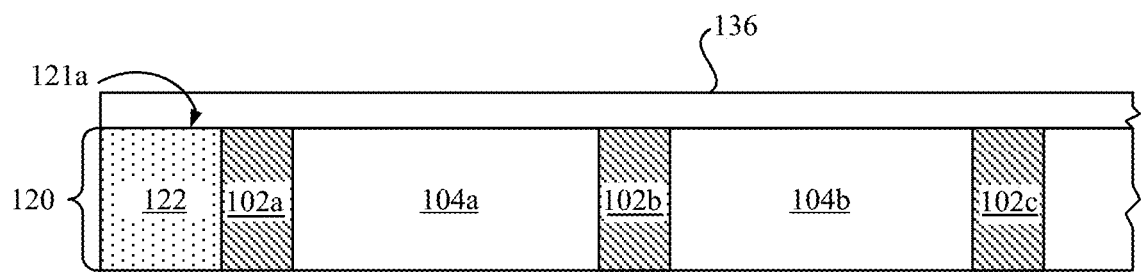
FIGS. 7A-7E describe a process for forming a wiring layer on a substrate according to a particular embodiment of the present invention.

Hereinafter, referring to FIGS. 7A-7E, a process for forming wiring layer 130 on substrate 120 is described in more detail. FIGS. 7A-5E illustrate cross-sectional views of a structure being fabricated at each step of the formation process of wiring layer 130 on substrate 120.

Figure 7B:
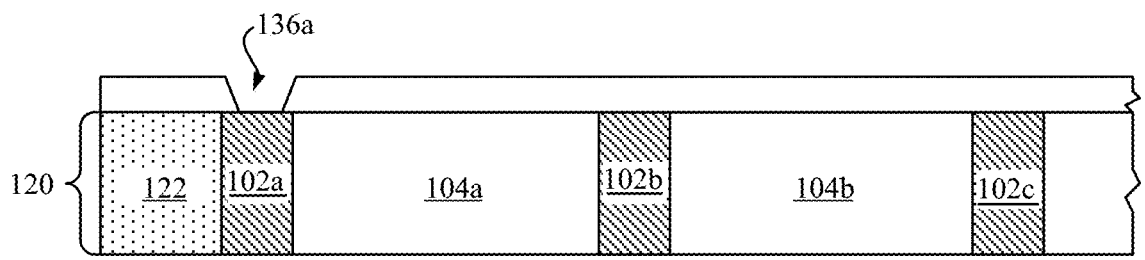

As shown in FIG. 7A, the formation process of wiring layer 130 may include a step of forming first dielectric layer 136 on top surface 121a of substrate 120. As shown in FIG. 7B, the formation process may include a step of opening via hole 136a through first dielectric layer 136 at a position corresponding to an edge surface of a conductive layer (e.g., conductive layer 102a) to be connected with first level. Via hole 136a can be opened by using any known techniques such as laser processing and photolithography.

Figure 7C:
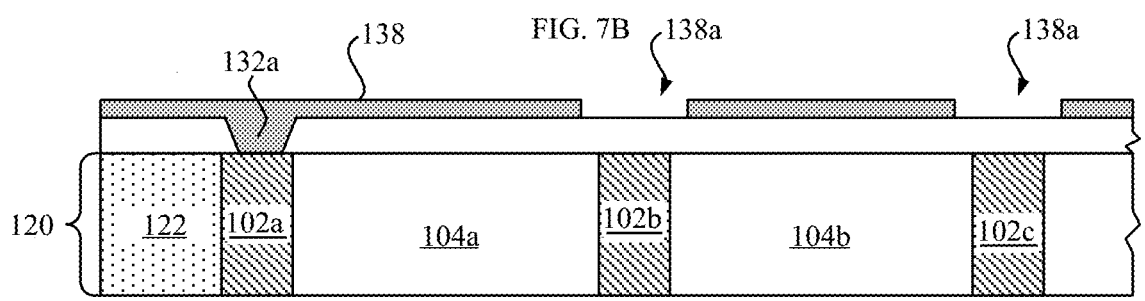

As shown in FIG. 7C, the formation process may include a step of patterning first conductive pattern layer 138 for the first level on first dielectric layer 136 and making via hole 136a conductive to form via 132a through first dielectric layer 136. First conductive pattern layer 138 may include conductive pattern and spaces 138a for clearance at positions where other vias connected with other level are fabricated in a later step.

In a particular embodiment in which the semi additive process is employed, the step of patterning first conductive pattern layer 138 may include a sub-step of forming a seed layer by electroless plating over first dielectric layer 136; a patterning a resist on the seed layer; forming the conductive pattern by electroplating on the seed layer other than area covered by the resist; and removing the patterned resist and the seed layer. Via 132a may be made conductive by filing via hole 136a with electroplated metal at the same time of forming the conductive pattern.

Figure 7D:
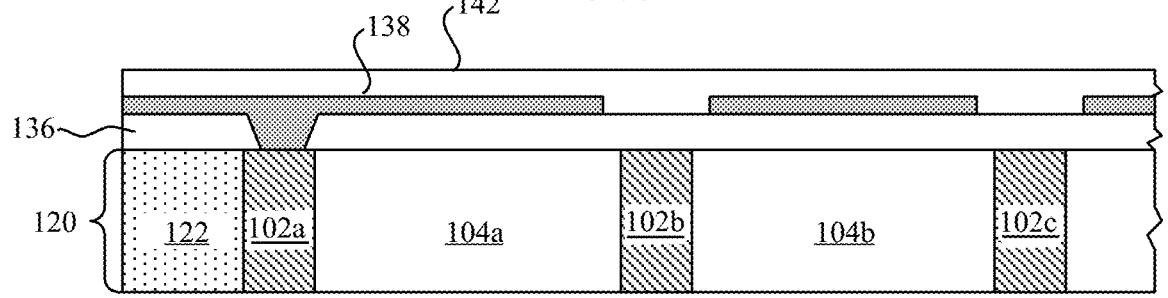
Figure 7E:
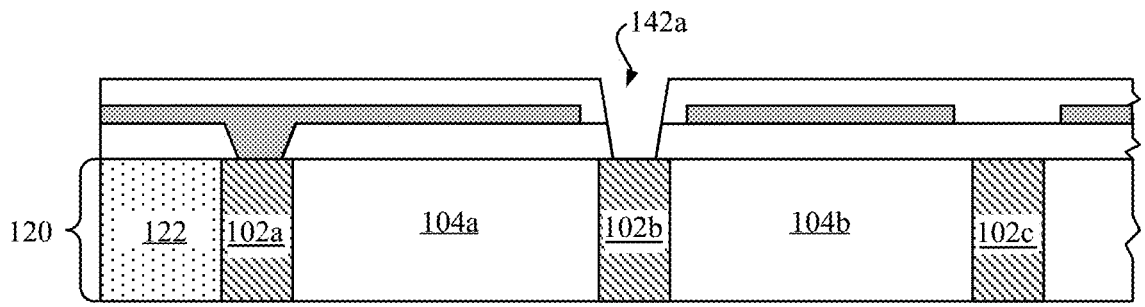

As shown in FIG. 7D, then, the formation process may include a step of forming second dielectric layer 142 on first dielectric layer 136 and first conductive pattern layer 138. As shown in FIG. 7E, the formation process may include a step of opening via hole 142a through first dielectric layer 136 and second dielectric layer 142 at a position corresponding to an edge surface of a conductive layer (e.g., conductive layer 102b) to be connected with second level. Subsequently, a second conductive pattern layer may be formed on second dielectric layer 142 and via hole 142a is made conductive to form a via through first dielectric layer 136, and second dielectric layer 142. In such manner, desired wiring structure can be built in wiring layer 130.

Referring to FIGS. 8A-8D, relationships between a wiring pattern in the wiring layer 130 and positions of vias are described. FIG. 8A shows a top view of stacked battery unit 100 embedded in substrate 120. FIGS. 8B and 8C illustrate conductive pattern layers 230 and 240 for first level (ground plane) and second level (second plane). FIG. 8D illustrates a cross-sectional view of battery embedded structure 110 including substrate 120 and wiring layer 130 with electronic component 152 mounted thereon. The cross-sectional view shown in FIG. 8D corresponds to a cross-section indicated by arrows "V" in FIG. 8A.

As shown in FIG. 8A, there are four vias (via 220a, 220b, 220c, and 220d) located at respective edge surfaces of the conductive layers (e.g., via 220d for conductive layer 102a). As representatively shown in FIG. 8B and FIG. 8C, clearance space 230a and clearance space 240a are provided in each conductive pattern layer 230 and 240 around positions where vias unconnected to respective planes are fabricated. In the wiring pattern shown in FIG. 8D, terminal 152a and terminal 152b of electronic component 152 are electrically connected to via 220a that is connected to the first plane (ground plane) and via 220c that is connected to the third plane (2×Z [V]), respectively. Thus, electronic component 152 receives power supply with the voltage of 2×Z [V] from two unit cells provided there between.

The fabrication process for battery embedded structure 110 can be simplified by adapting wafer level packaging technology thereto, thereby allowing fabricating the battery embedded structure with more cost-effective way. Referring to FIGS. 9A-9D and FIGS. 10A-10D, processes for fabricating battery embedded structure 110 by adaptation of wafer level packaging technology will be described. There are mainly two types of packaging technologies that are referred to as "chip-first" method and "RDL (redistribution layer)-first" method.

FIGS. 9A-9D illustrate a process for fabricating the battery embedded structure by applying process of wafer level packaging according to an exemplary embodiment of the present invention. The fabrication process shown in FIGS. 9A-9D is a so-called "battery unit" first process, in which arranging the stacked battery units is performed prior to the formation of wiring layer 130.

Figure 9A:
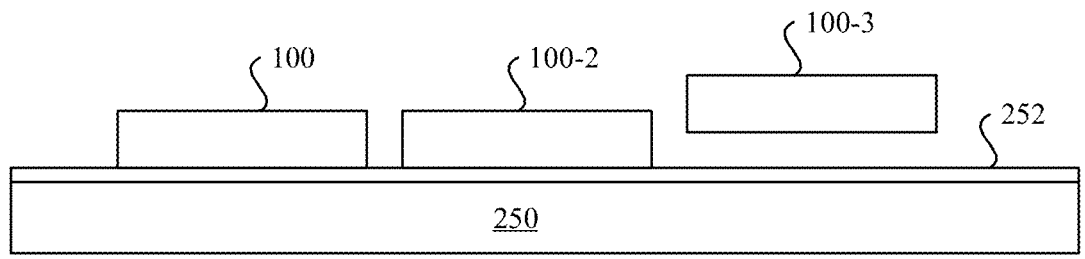
FIGS. 9A-9D illustrate a process for fabricating the battery embedded structure by applying process for wafer level packaging according to an exemplary embodiment of the present invention.

As shown in FIG. 9A, the fabrication process may include a step of preparing one or more stacked battery units (e.g., stacked battery units 100, 100-2, and 100-3) on support carrier 250 having adhesive tape 252 in a manner such that each stacked battery unit is placed on support carrier 250 with its side surface facing down. The one or more stacked battery units may be arranged in an array precisely on support carrier 250.

Figure 9B:
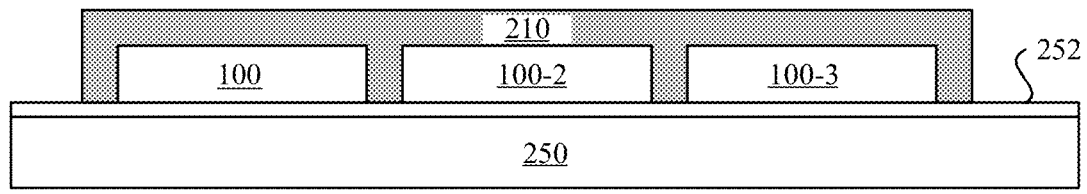

As shown in FIG. 9B, the fabrication process may also include a step of molding the one or more stacked battery units (e.g., stacked battery units 100, 100-2, and 100-3) with a resin as insulator material 210 on support carrier 250 by using an appropriate mold frame. The gaps between the stacked battery units may be filled by insulator material 210 and the one or more stacked battery units may be surrounded by the insulator material 210.

Figure 9C:
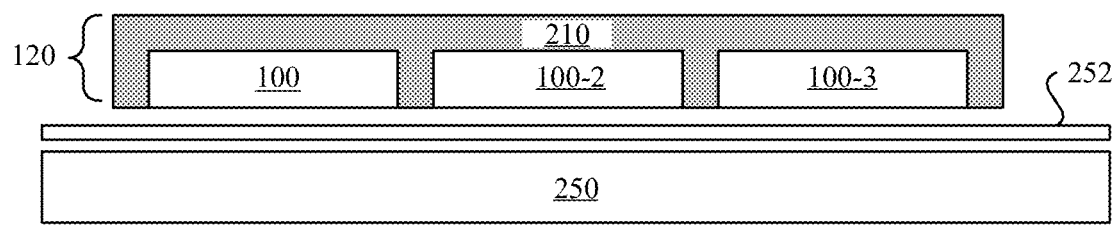

As shown in FIG. 9C, the fabrication process may further include a step of removing support carrier 250 with adhesive tape 252 from the one or more stacked battery units (e.g., stacked battery units 100, 100-2, and 100-3) molded by insulator material 210 to obtain substrate 120 that includes the one or more stacked battery units embedded therein. The one or more respective side surfaces of the one or more stacked battery units together with insulator material 210 may be polished to make the top surface of substrate 120 smooth and flat.

Figure 9D:
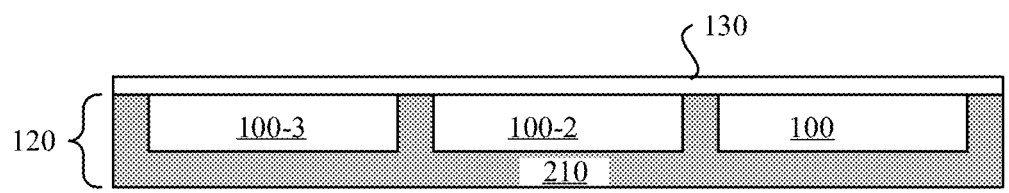

As shown in FIG. 9D, the fabrication process may include a step of forming wiring layer 130 that includes a plurality of electrical paths and a plurality of vias each connected with one of the electrical paths.

In this "battery unit" first process, wiring layer 130 may be bonded with the top surface of substrate 120 at the same time as wiring layer 130 is formed. Thus, formation of wiring layer 130 and bonding of wiring layer 130 with the top surface are simultaneously done by forming wiring layer 130 on substrate 120 posterior to the fabrication of substrate 120.

FIGS. 10A-10D illustrate a process for fabricating the battery embedded structure by applying a process of wafer level packaging according to another exemplary embodiment of the present invention. The fabrication process shown in FIGS. 10A-10D is a so called "wiring layer" first process, in which arranging the stacked battery units is performed posterior to formation of wiring layer 130.

Figure 10A:
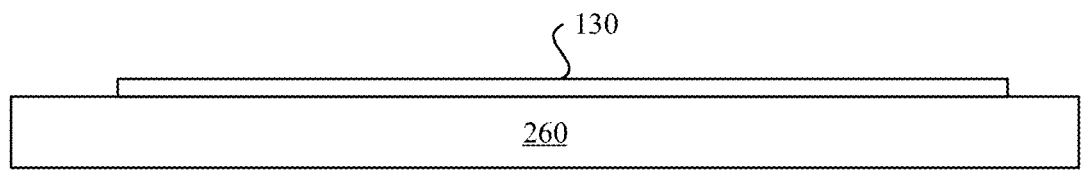
FIGS. 10A-10D illustrate a process for fabricating the battery embedded structure by applying process for wafer level packaging according to another exemplary embodiment of the present invention.
Figure 10B:
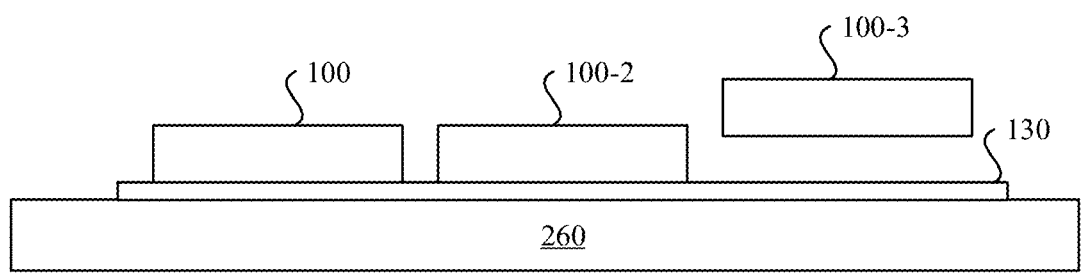

As shown in FIG. 10A, the fabrication process may include a step of forming wiring layer 130 that includes a plurality of electrical paths, a plurality of pads and a plurality of vias on support carrier 260. As shown in FIG. 10B, the fabrication process may include a step of preparing one or more stacked battery units (e.g., stacked battery units 100, 100-2, and 100-3) on wiring layer 130 that is formed on support carrier 260. Prior to arrangement of the stacked battery units, one side surface of each stacked battery units may be polished to make the side surface smooth and flat. The one or more stacked battery units (e.g., stacked battery units 100, 100-2, and 100-3) are arranged in an array precisely on wiring layer 130 with its polished side surface facing down.

Figure 10C:
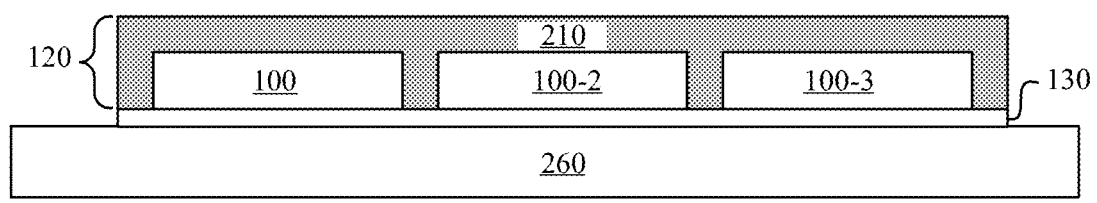
Figure 10D:
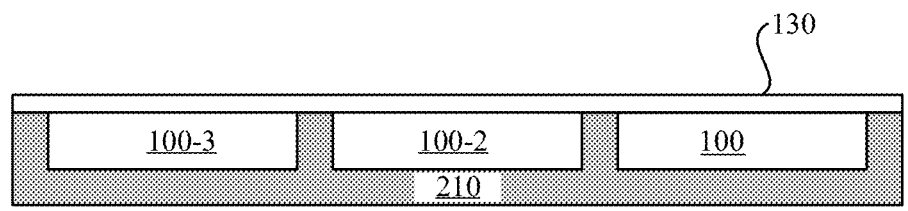

As shown in FIG. 10C, the fabrication process may include a step of molding the one or more stacked battery units (e.g., stacked battery units 100, 100-2, and 100-3) by a resin as insulator material 210 on wiring layer 130 by using appropriate mold frame to fabricate substrate 120. The gaps between the stacked battery units are filled by insulator material 210 and the one or more stacked battery units are surrounded by insulator material 210. As shown in FIG. 10D, the fabrication process may include a step of removing support carrier 260 from wiring layer 130.

In this wiring layer first process, wiring structure 130 may be bonded with the top surface of substrate 120 at the same time as substrate 120 is fabricated. Thus, fabrication of substrate 120 and bonding of wiring layer 130 with the top surface of substrate 120 are performed simultaneously by fabricating substrate 120 on wiring layer 130 posterior to the formation of wiring layer 130.

Figure 11:
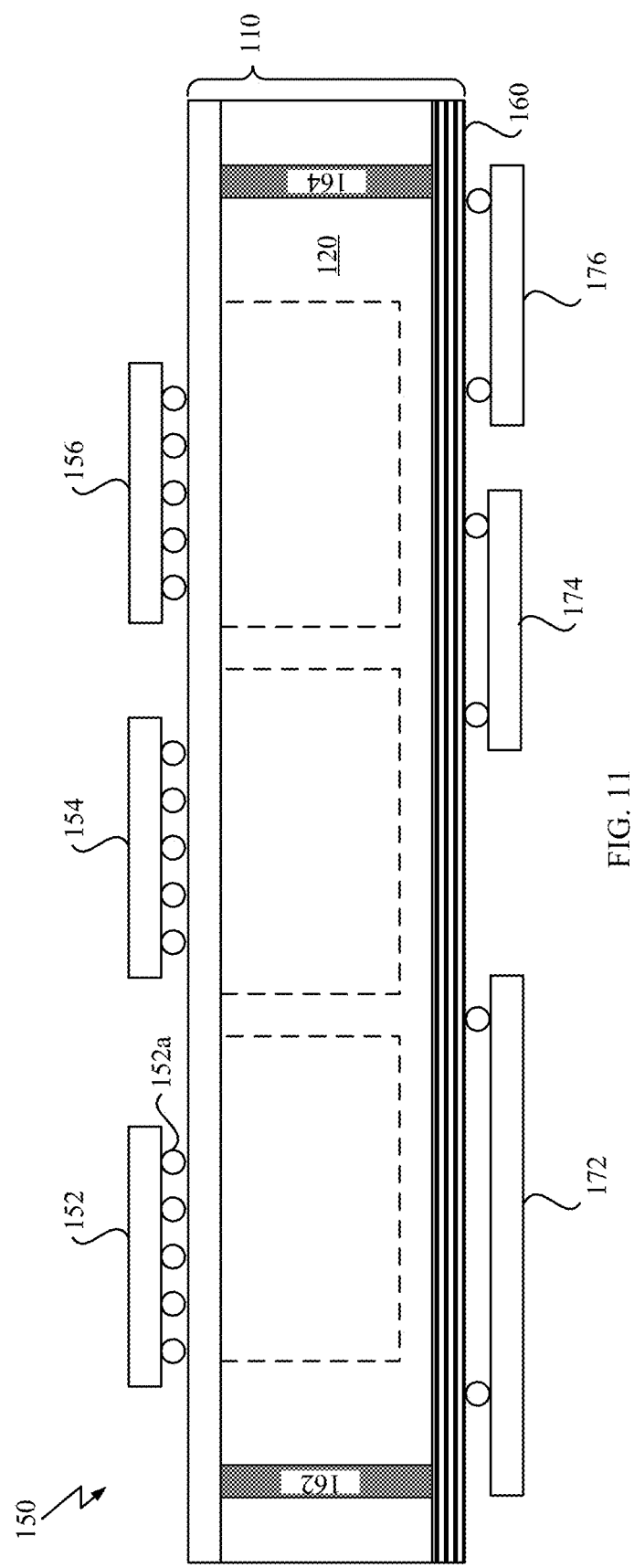
FIG. 11 illustrates a side view of an electronic device including the battery embedded structure according to an exemplary embodiment of the present invention.

Referring to FIG. 11, an electronic device including battery embedded structure 110 as an interposer is shown.

FIG. 11 illustrates a side view of electronic device 150. Note that outlines of the stacked battery units embedded in substrate 120 are indicated by dashed lines in FIG. 11.

As shown in FIG. 11, electronic device 150 includes the aforementioned battery embedded structure 110 and one or more electronic components, electronic components 152, 154, and 156, mounted on the top side surface of battery embedded structure 110. Each electronic component (e.g., electronic component 152) has respective terminals (e.g., terminal 152a) by which each electronic component is mounted on pads of battery embedded structure 110. In the example shown in FIG. 11, battery embedded structure 110 further includes backside wiring layer 160 formed on the bottom surface of substrate 120 and one or more electronic components, electronic components 172, 174, and 176, mounted on the backside surface of battery embedded structure 110. Furthermore, through vias 162 and 164 are formed through substrate 120 at an outer region of a part where the one or more stacked battery units are arranged so as to give electrical paths between electronic components 152, 154, and 156, on top side of battery embedded structure 110 and electronic components 172, 174, and 176, on the backside of battery embedded structure 110.

Hereinafter, referring to a series of FIGS. 12A-12C, 13A-13B, 14A-14B, and 15A-15B, exemplary layouts of pads, vias, and circuits (electrical path) for the battery embedded structure, which allows utilizing the total amount of battery embedded structure 110 more efficiently, according to the exemplary embodiment of the present invention.

Figure 12A:
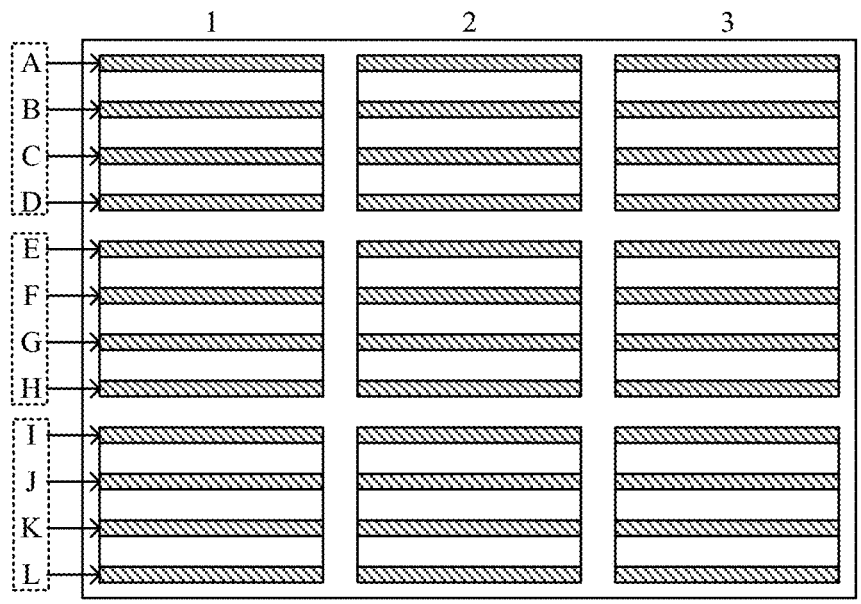
FIGS. 12A-12C describe an exemplary layout of pads, vias and circuits for the battery embedded structure according to an exemplary embodiment of the present invention.
Figure 12B:
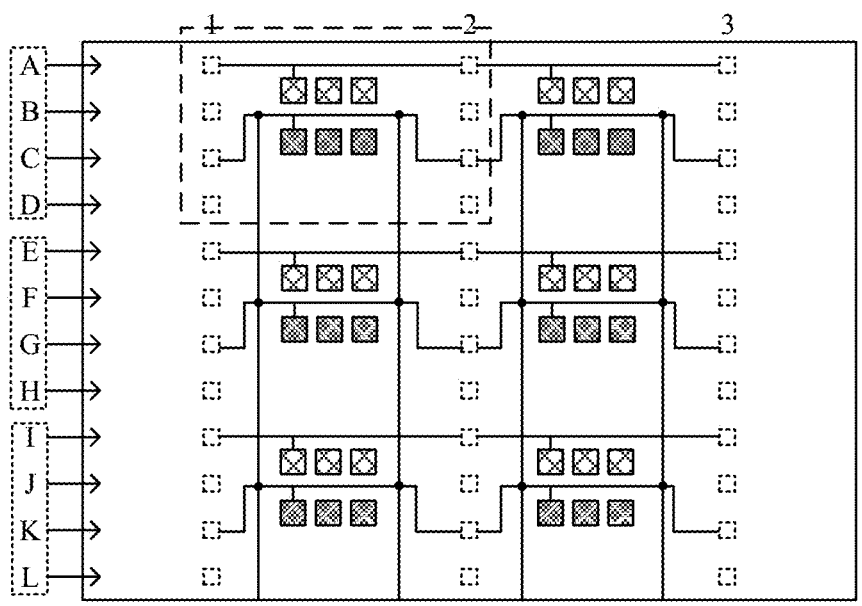
Figure 12C:
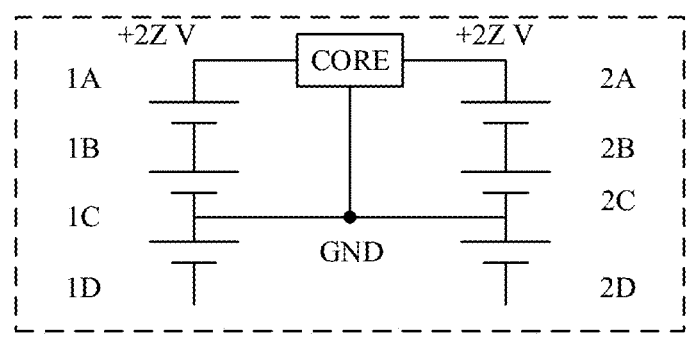

FIGS. 12A-12C describe an exemplary layout of pads, vias and circuit for the battery embedded structure in a case where one type of an electronic component (e.g., processor core) is mounted on battery embedded structure 110.

FIG. 12A shows a layout of the stacked battery units and assignment of reference symbols (A-L and 1-3) to the conductive layers in the one or more stacked battery units. FIG. 12B shows a layout of pads, vias and circuits in the wiring layer in this example. The cross hatching patterns on white background represent locations of the pads for one terminal of the electronic component. The cross hatching patterns on gray background represent locations of the pads for ground terminal of the electronic component. FIG. 12C shows an equivalent circuit of a unit block of the layout indicated by a dashed rectangle in FIG. 12B.

A group of the pads for one terminal of the electronic component is connected to a group of vias denoted by 1A and 2A in the unit block. A group of the pads for the ground terminal is connected to a group of vias denoted by 1C and 2C in the unit block. As shown in FIGS. 12A-12C, the electronic component receives a power supply with the voltage of Z×2 [V], that is double of the single cell voltage Z, from two battery cells (each of which includes two unit cells between conductive layers denoted by 1A and 1C or 2A and 2C) connected in parallel. In FIGS. 12A-12C, the unit cells between the vias for conductive layers denoted by 1C and 2C and the vias for conductive layers denoted by 1D and 2D can be used as a backup power supply.

Figure 13A:
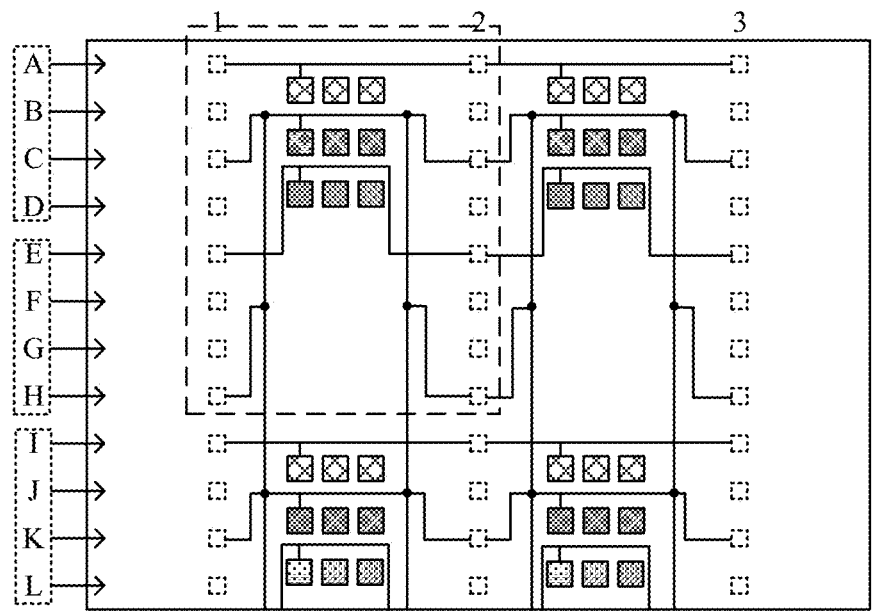
FIGS. 13A-13B describe other exemplary layout of pads, vias, and circuits for the battery embedded structure according to the exemplary embodiment of the present invention.
Figure 13B:
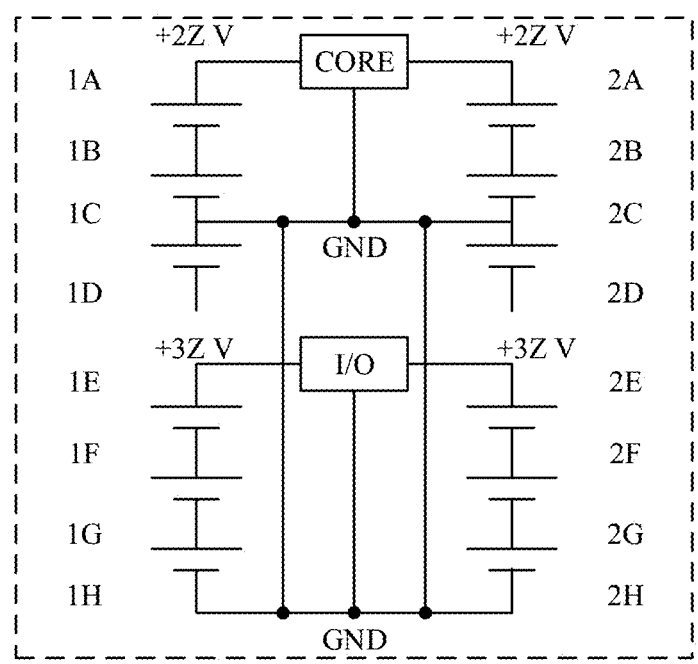

FIGS. 13A-13B describe another exemplary layout of pads, vias and circuits for the battery embedded structure in a case where two types of electronic components with different supply voltage requirements (e.g., processor core and I/O controller in a chip) are mounted on battery embedded structure 110.

FIG. 13A shows a layout of pads, vias and circuits in wiring layer 130 for in this example. Note that the layout of the stacked battery units and assignment of the reference symbols to the conductive layers is identical to that shown in FIG. 12A. The cross hatching patterns on white background represent locations of the pads for a first electronic component (e.g., processor core). The dot hatching patterns represent locations of the pads for a second electronic component (e.g., I/O). The cross hatching patterns on gray background represent locations of the pads for a common ground of both of the first and second electronic components (e.g., processor core and I/O). FIG. 13B shows an equivalent circuit of a unit block of the layout indicated by a dashed rectangle in FIG. 13A.

A group of the pads for the first electronic component (e.g., processor core) is connected to a group of vias denoted by 1A and 2A in the unit block. A group of the pads for the second electronic component (e.g., I/O) is connected to a group of vias denoted by 1E and 2E. A group of the pads for the ground terminal is connected to a group of vias denoted by 1C, 1H, 2C and 2H.

As shown in FIG. 13A-13B, the first electronic component (e.g., processor core) receives a power supply with the voltage of Z×2 [V] from respective two battery cells (each of which includes two unit cells between conductive layers denoted by 1A and 1C or 2A and 2C) connected in parallel. At the same time, the second electronic component (e.g., I/O) receives a power supply with the voltage of Z×3 [V], that is triple of the single cell voltage Z, from respective two battery cells (each of which includes three unit cells between conductive layers denoted by 1E and 1H or 2E and 2H) connected in parallel. In FIG. 13A-13B, the unit cells between the vias for conductive layers denoted by 1C and 2C and the vias for conductive layers denoted by 1D and 2D can also be used as a backup power supply.

Figure 14A:
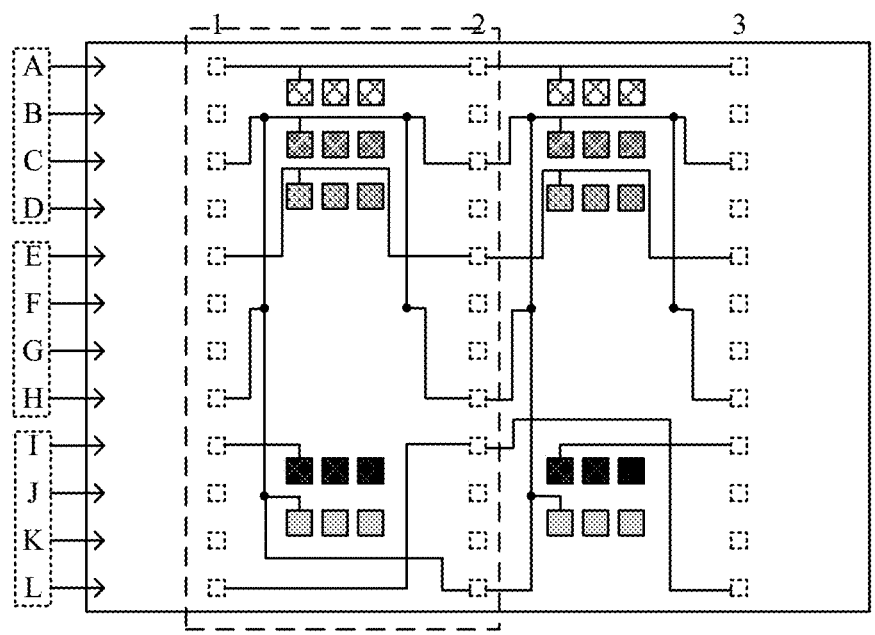
FIGS. 14A-14B describe further other exemplary layout of pads, vias and circuits for the battery embedded structure according to the exemplary embodiment of the present invention.
Figure 14B:
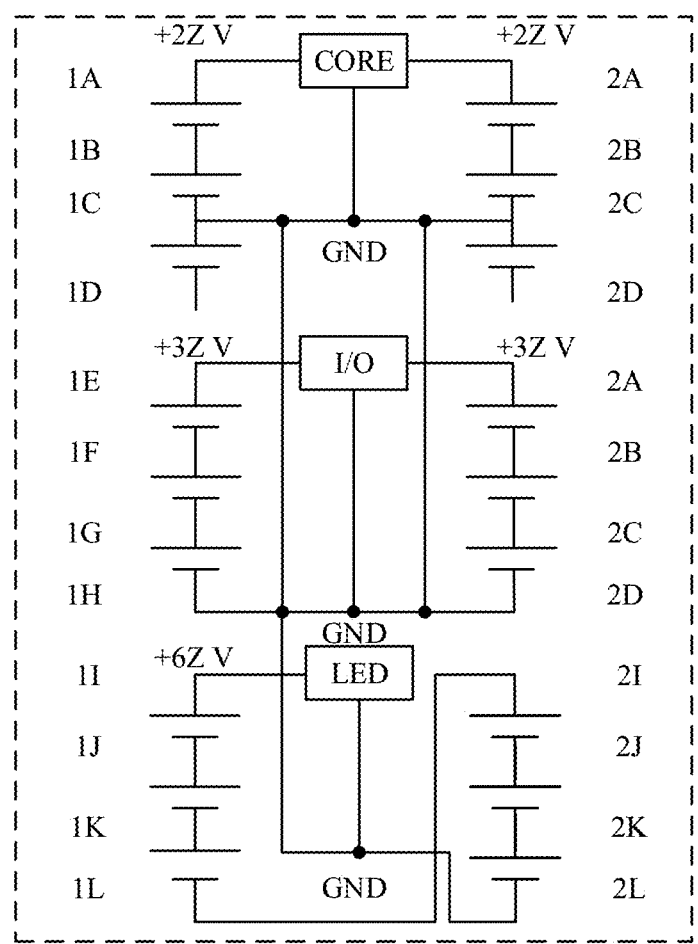

FIGS. 14A-14B describe further yet another exemplary layout of pads, vias and circuits for the battery embedded structure in a case where three types of electronic components having different supply voltage requirements (e.g., processor core, I/O controller and a LED) are mounted on battery embedded structure 110.

FIG. 14A shows a layout of pads, vias and circuits in wiring layer 130 in this example. Note that the layout of the stacked battery units and assignment of reference symbols to the conductive layers is identical to that shown in FIG. 12A. Representation of the pads for first and second electronic components (e.g., processor core and I/O) is same as those shown in FIG. 13A. The black square represents the pads for third electronic component (e.g., LED) and the white square represents the pads for ground terminal of the third electronic components (e.g., LED). FIG. 14B shows an equivalent circuit of a unit block of the layout indicated by a dashed rectangle in FIG. 14A.

A group of the pads for the third electronic component (e.g., LED) is connected to a via denoted by 1I in the unit block. A group of the pads for ground terminal of the third electronic component is connected to a via denoted by 2L.

As shown in FIGS. 14A-14B, the first electronic component (e.g., processor core) and second the electronic component (e.g., I/O) receive power supplies with the voltage of Z×2 [V] and Z×3 [V] from respective two battery cells connected in parallel, respectively. At the same time, the third electronic component (e.g., LED) receives a power supply with the voltage of Z×6 [V] from respective two battery cells (each of which includes three unit cells between conductive layers denoted by 1I and 1L or 2I and 2L) connected in series, each of which has the voltage of Z×3 [V].

Figure 15A:
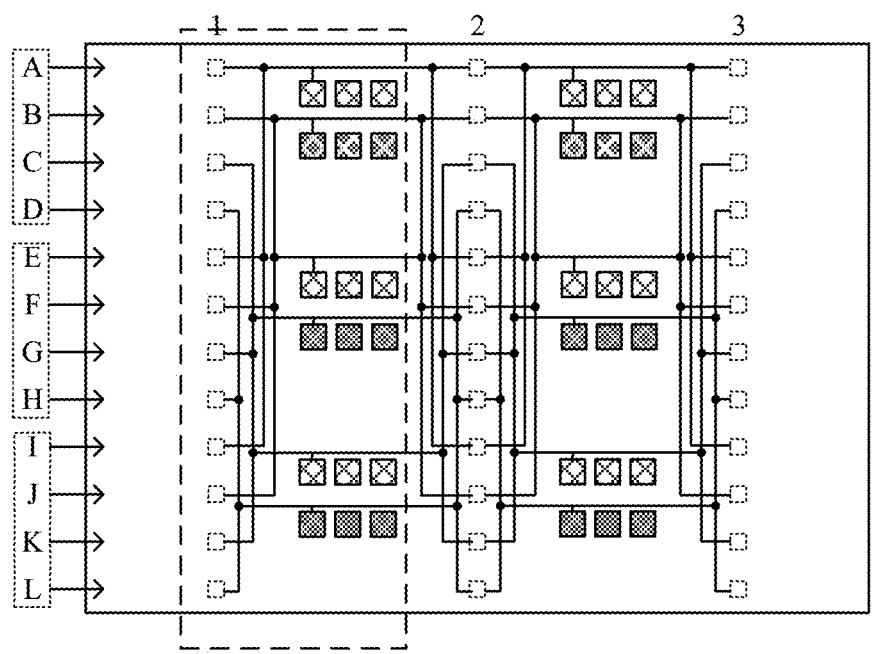
FIGS. 15A-15B describe another exemplary layout of pads, vias, and circuits for the battery embedded structure according to the exemplary embodiment of the present invention.
Figure 15B:
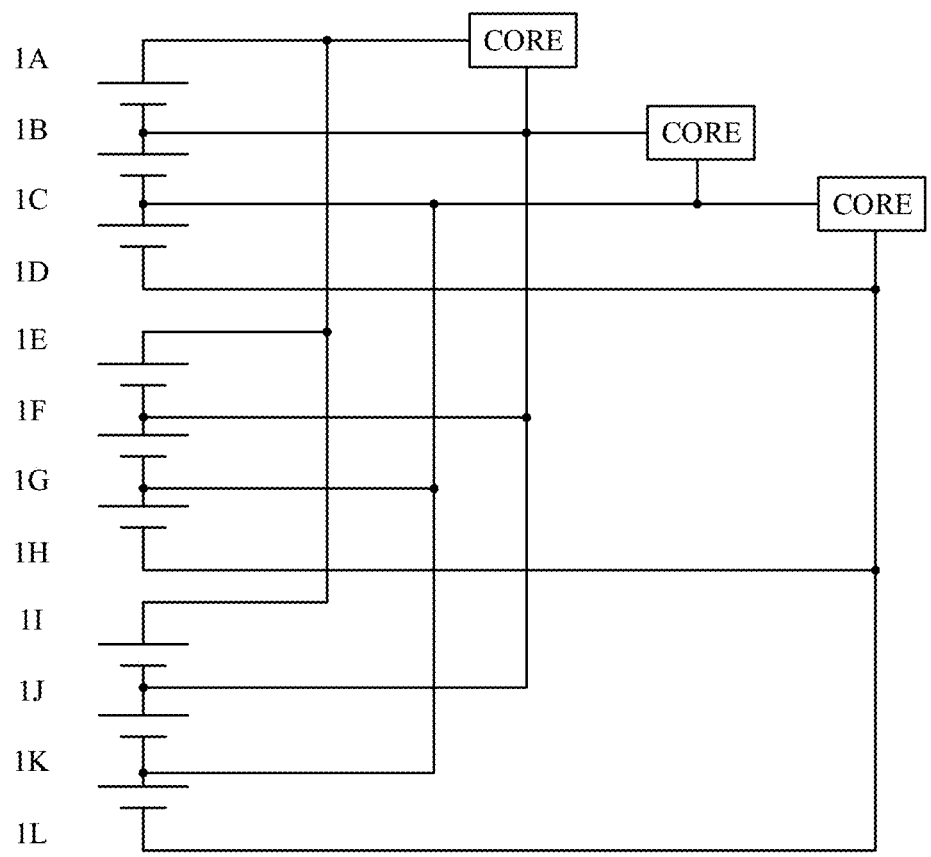

FIGS. 15A-15B describe another exemplary layout of pads, vias and circuits for the battery embedded structure in a case where a plurality of electronic components of the same type (e.g., processor cores) are mounted onto battery embedded structure 110.

FIG. 15A shows a layout of pads, vias and circuits in wiring layer 130 in this example. Note that the layout of the stacked battery units and assignment of reference symbols to the conductive layers is identical to that shown in FIG. 12A. Representation of the pads in FIG. 15A is same as those shown in FIG. 12A. FIG. 15B shows an equivalent circuit of a unit block of the layout indicated by a dashed rectangle in FIG. 15A.

One group of the pads for one terminal of the first electronic component (e.g., first processor core) is connected to a group of vias denoted by 1A, 1E and 1I in the unit block. Other group of the pads for the first electronic component and one group of the pads for one terminal of the second electronic component (e.g., second processor core) is connected to a group of vias denoted by 1B, 1F and 1J. Other group of the pads for the second electronic component and one group of the pads for one terminal of the third electronic component (e.g., third processor core) is connected to a group of vias denoted by 1C, 1G and 1K. Other group of the pads for the third electronic component (e.g., third processor core) is connected to a group of vias denoted by 1D, 1H and 1L.

As shown in FIGS. 15A-15B, each electronic component (e.g., processor core) receives a power supply with the voltage of Z×1 [V], that is single cell voltage Z, from totally six battery cells (each of which includes one unit cells between adjacent conductive layers) connected in parallel. In the layout shown in FIGS. 15A-15B, the electronic component would receive power supply, in parallel, from a plurality of unit cells that belongs to different stacked battery units among the one or more stacked battery units, which allows utilizing the total amount of battery embedded structure 110 more efficiently.

Electronic components for mobile devices may have different requirements on supply voltage and/or discharge capacity. For example, in a particular example, supply voltages for a processor, an I/O, a LED and a PCM (Phase change memory) are 0.8 [V], 1.2 [V], 2~4 [V] and 3 [V], respectively. Characteristics of power consumption may also be different across different types of the electronic components.

According to one or more embodiments of the present invention, the novel battery embedded structure 110 can provide ways for supplying power to one or more electronic components with respective voltages and/or discharge capacities from battery embedded structure 110 even when there are plural electronic components with different requirements.

In one or more embodiments, voltage and/or discharge capacity provided to each electronic component are determined by selectively connecting groups of the vias and group of the pads in wiring layer 130. Power loss due to voltage conversion by a regulator can be preferably avoided, thereby enabling to utilize electric power in the battery embedded structure effectively.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, steps, layers, elements, and/or components, but do not preclude the presence or addition of one or more other features, steps, layers, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects of the present invention has been presented for purposes of illustration and description, but is not intended to be exhaustive or limited to the invention in the form disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a battery embedded structure, the method comprising:
   preparing one or more stacked battery units, wherein each stacked battery unit of the one or more stacked battery units includes two or more conductive layers and one or more unit cells, wherein each unit cell of the one or more unit cells is disposed between two conductive layers of the two or more conductive layers;
   fabricating a substrate including the one or more stacked battery units by arranging the one or more stacked battery units in at least one dimension to form an array, wherein the substrate has a principal surface provided by one or more respective side surfaces of the one or more stacked battery units;
   filling insulator into gaps between the one or more stacked battery units in the array;
   polishing the one or more respective side surfaces of the one or more stacked battery units together with the insulator to smooth the principal surface of the substrate;
   forming a wiring layer, wherein the wiring layer includes a plurality of electrical paths and a plurality of vias, wherein each via of the plurality of vias is connected with one electrical path of the plurality of electrical paths; and
   bonding the wiring layer with the principal surface of the substrate, wherein each via of the plurality of vias is located at a position corresponding to an edge surface of a conductive layer of the two or more conductive layers of the one or more stacked battery units so as to contact electrically to that conductive layer, and wherein forming the wiring layer and bonding the wiring layer with the principal surface are performed simultaneously by forming the wiring layer on the principal surface of the substrate posterior to the fabricating the substrate.

2. The method of claim 1, wherein fabricating the substrate comprises:
   molding the one or more stacked battery units on a carrier by a resin as the insulator; and
   removing the carrier from the one or more stacked battery units molded by the resin.

3. The method of claim 1, wherein forming the wiring layer comprises:
   forming a dielectric layer on the substrate;

patterning a conductive pattern layer on the dielectric layer; and fabricating the plurality of vias through the dielectric layer.

4. A method for fabricating a battery embedded structure, the method comprising:

preparing one or more stacked battery units, wherein each stacked battery unit of the one or more stacked battery units includes two or more conductive layers and one or more unit cells, wherein each unit cell of the one or more unit cells is disposed between two conductive layers of the two or more conductive layers;

fabricating a substrate including the one or more stacked battery units by arranging the one or more stacked battery units in at least one dimension to form an array, wherein the substrate has a principal surface provided by one or more respective side surfaces of the one or more stacked battery units;

filling insulator into gaps between the one or more stacked battery units in the array;

polishing the one or more respective side surfaces of the one or more stacked battery units together with the insulator to smooth the principal surface of the substrates forming a wiring layer, wherein the wiring layer includes a plurality of electrical paths and a plurality of vias, wherein each via of the plurality of vias is connected with one electrical path of the plurality of electrical paths; and bonding the wiring layer with the principal surface of the substrate, wherein each via of the plurality of vias is located at a position corresponding to an edge surface of a conductive layer of the two or more conductive layers of the one or more stacked battery units so as to contact electrically to that conductive layer, and wherein fabricating the substrate and bonding the wiring layer with the principal surface are performed simultaneously.

5. The method of claim 4, wherein forming the wiring layer comprises disposing the wiring layer on a carrier, and wherein fabricating the substrate comprises:

arranging the one or more stacked battery units on the wiring layer in at least one dimension to form an array;

molding the one or more stacked battery units by a resin on the wiring layer; and removing the carrier from the wiring layer.

* * * * *